(12) United States Patent
Coenegracht et al.

(10) Patent No.: US 10,476,250 B2
(45) Date of Patent: Nov. 12, 2019

(54) SEALING BLOCK ARRANGEMENTS FOR ENCLOSURES

(71) Applicant: CommScope Connectivity Belgium BVBA, Kessel-Lo (BE)

(72) Inventors: Philippe Coenegracht, Hasselt (BE); Alexandre Caroline M. De Bie, Beauvechain (BE); Maddy Nadine Frederickx, Aarschot (BE); Paul Joseph Claes, Tremelo (BE); Geert Van Genechten, Vorselaar (BE); Mohamed Aznag, Scherpenheuvel (BE); Diederik Houben, Berbroek (BE)

(73) Assignee: COMMSCOPE CONNECTIVITY BELGIUM BVBA, Kessel-Lo (BE)

( * ) Notice: Subject to any disclaimer, the term of this patent is extended or adjusted under 35 U.S.C. 154(b) by 0 days.

(21) Appl. No.: 15/760,196

(22) PCT Filed: Sep. 13, 2016

(86) PCT No.: PCT/EP2016/071520
§ 371 (c)(1),
(2) Date: Mar. 14, 2018

(87) PCT Pub. No.: WO2017/046063
PCT Pub. Date: Mar. 23, 2017

(65) Prior Publication Data
US 2018/0278037 A1    Sep. 27, 2018

Related U.S. Application Data

(60) Provisional application No. 62/218,248, filed on Sep. 14, 2015.

(51) Int. Cl.
*H05K 5/06*      (2006.01)
*H02G 15/013*    (2006.01)
(Continued)

(52) U.S. Cl.
CPC .......... *H02G 15/013* (2013.01); *H02G 3/083* (2013.01); *H02G 3/088* (2013.01); *H05K 5/069* (2013.01); *H02G 15/113* (2013.01)

(58) Field of Classification Search
CPC ....................................................... H05K 5/069
See application file for complete search history.

(56) References Cited

U.S. PATENT DOCUMENTS 4,733,016 A * 3/1988 Twist ................. F16L 5/08
174/657
5,493,068 A * 2/1996 Klein ................. H02G 3/22
174/151

(Continued)

FOREIGN PATENT DOCUMENTS

EP    0 442 941 B1    1/1995
EP    0 587 616 B1    7/1996

(Continued)

OTHER PUBLICATIONS

International Search Report and Written Opinion of the International Searching Authority for corresponding International Patent Application No. PCT/EP2016/071520 dated Nov. 28, 2016, 12 pages.

*Primary Examiner* — Hung V Ngo
(74) *Attorney, Agent, or Firm* — Merchant & Gould P.C.

(57) ABSTRACT

An enclosure includes a housing having sealing block arrangements disposed at corners of the housing. Each sealing block arrangement includes a containment wall to maintain sealant at the cable ports. A user can choose which corner ports are sealed or blocked by the sealing block arrangements. Each sealing block arrangement includes two volumes of sealant, a sealant containment wall, and two spring elements. Each containment wall includes contain- (Continued)

ment elements that separate from each other to allow passage of a cable through the sealing block.

25 Claims, 11 Drawing Sheets

(51) Int. Cl.
*H02G 3/08* (2006.01)
*H02G 15/113* (2006.01)

(56) References Cited

U.S. PATENT DOCUMENTS

| | | | | |
|---|---|---|---|---|
| 5,783,776 A | * | 7/1998 | Birmingham | F16L 5/08 174/657 |
| 7,603,018 B2 | | 10/2009 | Mullaney et al. | |
| 8,598,472 B2 | * | 12/2013 | Hildingsson | F16L 5/08 174/362 |

FOREIGN PATENT DOCUMENTS

| | | |
|---|---|---|
| EP | 2 523 287 A1 | 11/2012 |
| GB | 576 919 A | 4/1946 |
| WO | 2005/124958 A1 | 12/2005 |
| WO | 2009/029259 A1 | 3/2009 |
| WO | 2012/088565 A1 | 7/2012 |

\* cited by examiner

SEALING BLOCK ARRANGEMENTS FOR ENCLOSURES

CROSS-REFERENCE TO RELATED APPLICATION

This application is a National Stage Application of PCT/EP2016/071520, filed on Sep. 13, 2016, which claims the benefit of U.S. Patent Application Ser. No. 62/218,248, filed on Sep. 14, 2015, the disclosures of which are incorporated herein by reference in their entireties. To the extent appropriate, a claim of priority is made to each of the above disclosed applications.

BACKGROUND

Cables are often routed through various structures such as an enclosure. The interior of the enclosure may be a protected environment while the exterior of the enclosure may be an unprotected environment subject to varying conditions, such as inclement weather, heat, cold, dirt, debris, moisture, sunlight, and/or the like. To pass the cable into or out of the interior of the enclosure, the cable is received through an opening within the structure. While the opening provides access to the interior of the enclosure, the opening may also allow undesirable substances into the protected enclosure and/or may expose the interior of the enclosure. For example, the opening may allow dirt, debris, and/or moisture into the enclosure, and/or may expose the interior of the enclosure to inclement weather, heat, cold, and/or sunlight. Cable entry seals are typically used to seal the opening within the structure through which the cable is received. In some cases, cable entry seals include a body that extends through, and is sealingly engaged with, the structure opening. The body includes a passageway for receiving the cable therethrough.

Improvements are desired.

SUMMARY

Some aspects of the disclosure are directed to a sealing unit including a sealant arrangement; a sealant containment wall positioned at an outer side of the sealant arrangement; a first spring element; and a second spring element. The sealant arrangement includes first and second volumes of sealant that meet at a cable sealing interface. The sealant containment wall includes a first set of containment elements providing containment of the first volume of sealant at the outer side of the sealant arrangement and a second set of containment elements providing containment of the second volume of sealant at the outer side of the sealant arrangement. The containment elements of the first set of containment elements meet the containment elements of the second set of containment elements at a boundary that generally aligns with the cable sealing interface. The containment elements of the first and second sets of containment elements are configured to slide in opposite directions away from the boundary to allow passage of a cable through the sealant containment wall. The first spring element is configured to bias the containment elements of the first set of containment elements toward the boundary. The second spring element is configured to bias the containment elements of the second set of containment elements toward the boundary.

In certain implementations, the containment elements of the first set of containment elements include first plates arranged in a first stack in front of the first volume of sealant. The containment elements of the second set of containment elements include second plates arranged in a second stack in front of the first volume of sealant.

In certain examples, the first plates are stacked one in front of the other along an orientation perpendicular relative to an outer side of the first volume of sealant. The second plates are stacked one in front of the other along an orientation perpendicular relative to an outer side of the second volume of sealant.

In certain examples, at least some of the first plates have cut-outs positioned adjacent the boundary. At least some of the second plates have corresponding cut-outs positioned adjacent the boundary. The cut-outs of the first and second plates cooperate to define a cable passage through the sealant containment wall.

In an example, outer ones of the first plates have larger cut-outs than inner ones of the first plates. Outer ones of the second plates have larger cut-outs than inner ones of the second plates.

In certain implementations, the first plates are first strips and the second plates are second strips. In certain examples, the first strips are stacked one adjacent the other along an orientation parallel relative to an outer side of the first volume of sealant and the second strips are stacked one adjacent the other along an orientation parallel relative to an outer side of the second volume of sealant.

In certain examples, the first and second strips each define elongate openings that are elongated along an orientation perpendicular to the boundary. In an example, the sealing unit includes a strip holder having a first retention member that passes through the elongate openings of the first strips and a second retention member that passes through the elongate openings of the second strips. The first strips are slidable relative to the first retention member and the second strips are slidable relative to the second retention member.

Other aspects of the disclosure are directed to an enclosure including a housing; and a sealing block. The housing defines a sealing block mount at a corner of the housing. The sealing block mount defines a sealing block receptacle. The sealing block mount includes first and second walls that are angled relative to one another and cooperate to define the corner. The first wall defines a first cable port and the second wall defining a second cable port. The sealing block mounts within the sealing block receptacle. The sealing block includes first and second opposite sides. The sealing block also includes third and fourth opposite sides that extend between the first and second opposite sides. The sealing block is configured to mount within the sealing block receptacle with the first side in alignment with the first cable port and the third side in alignment with the second cable port.

In certain implementations, the sealing block defines a sealed cable routing path that extends between the first and second sides such that a cable can be routed through the first cable port and through the sealing block along the sealed cable routing path into an interior of the housing.

In certain implementations, the third side of the sealing block closes and seals the second cable port.

In certain examples, the third side of the sealing block is configured such a cable is prevented from being routed into the housing through the second cable port.

In an example, the housing includes a second corner defining another one of the sealing block mounts that contains another one of the sealing blocks. The enclosure is selectively configurable in any one of an in-line cable configuration, a butt-style cable configuration, or an angled cable configuration by selecting appropriate sealing block arrangements.

Other aspects of the disclosure are directed to a sealing block kit for use with an enclosure including a base and a cover that cooperate to define a sealing block mount disposed at a corner of the housing. The sealing block mount includes a first receptacle defined in the base and a second receptacle defined in the cover. The second receptacle opposes the first receptacle. The sealing block mount also defines a first cable port and a second cable port. The sealing block kit includes: a plurality of first sealing blocks; and a plurality of second sealing blocks. Each first sealing block is configured to mount within any of the first and second receptacles. Each first sealing block includes pass-through sides that align along a corresponding sealed cable routing path. Each first sealing block also includes sealing sides that extend between the pass-through sides. Each first sealing block is configured to mount within the first receptacle so that the pass-through sides of the sealing block arrangement align with the first cable port and the sealing sides align with the second cable port. Each first sealing block is configured to mount within the second receptacle so that the pass-through sides of the sealing block arrangement align with the second cable port and the sealing sides align with the first cable port. Each second sealing block is configured to mount within any of the first and second receptacles. Each second sealing block includes pass-through sides that align along a corresponding sealed cable routing path. Each second sealing block also includes sealing sides that extend between the pass-through sides. Each second sealing block is configured to mount within the first receptacle so that the pass-through sides of the sealing block arrangement align with the second cable port and the sealing sides align with the first cable port. Each second sealing block is configured to mount within the second receptacle so that the pass-through sides of the sealing block arrangement align with the first cable port and the sealing sides align with the second cable port.

In certain implementations, a first of the first sealing blocks and a first of the second sealing blocks cooperate to define a first sealing block arrangement disposed within the sealing block mount.

In certain examples, the housing defines a second sealing block mount at a second corner of the housing. A second of the first sealing blocks and a second of the second sealing blocks cooperate to define a second sealing block arrangement disposed within the second sealing block.

In an example, the first of the sealing blocks of the first and second sealing block arrangements are disposed in the first receptacles of the first and second sealing block mounts. In another example, the second of the sealing blocks of the first and second sealing block arrangements are disposed in the first receptacles of the first and second sealing block mounts. In yet another example, the first of the sealing blocks of the first sealing block arrangement is disposed in the first receptacle of the first sealing block mount and wherein the second of the sealing blocks of the second sealing block arrangement is disposed in the first receptacle of the second sealing block mount.

A variety of additional inventive aspects will be set forth in the description that follows. The inventive aspects can relate to individual features and to combinations of features. It is to be understood that both the forgoing general description and the following detailed description are exemplary and explanatory only and are not restrictive of the broad inventive concepts upon which the embodiments disclosed herein are based.

BRIEF DESCRIPTION OF THE DRAWINGS

The accompanying drawings, which are incorporated in and constitute a part of the description, illustrate several aspects of the present disclosure. A brief description of the drawings is as follows.

DETAILED DESCRIPTION

Reference will now be made in detail to exemplary aspects of the present disclosure that are illustrated in the accompanying drawings. Wherever possible, the same reference numbers will be used throughout the drawings to refer to the same or like parts.

The present disclosure is directed to a sealing unit to provide environmental sealing at a cable sealing interface. For example, such a sealing unit can be used at a port of an enclosure to enable a cable to pass through the port while inhibiting contaminants from entering the enclosure. The sealing unit includes containment elements providing a containment wall about one or more volumes of sealant. The containment elements are configured to slide away from the cable sealing interface to allow passage of a cable through the sealant containment wall. The sealing unit can be rotated to face the containment wall towards a desired one of multiple ports.

Figure 1:
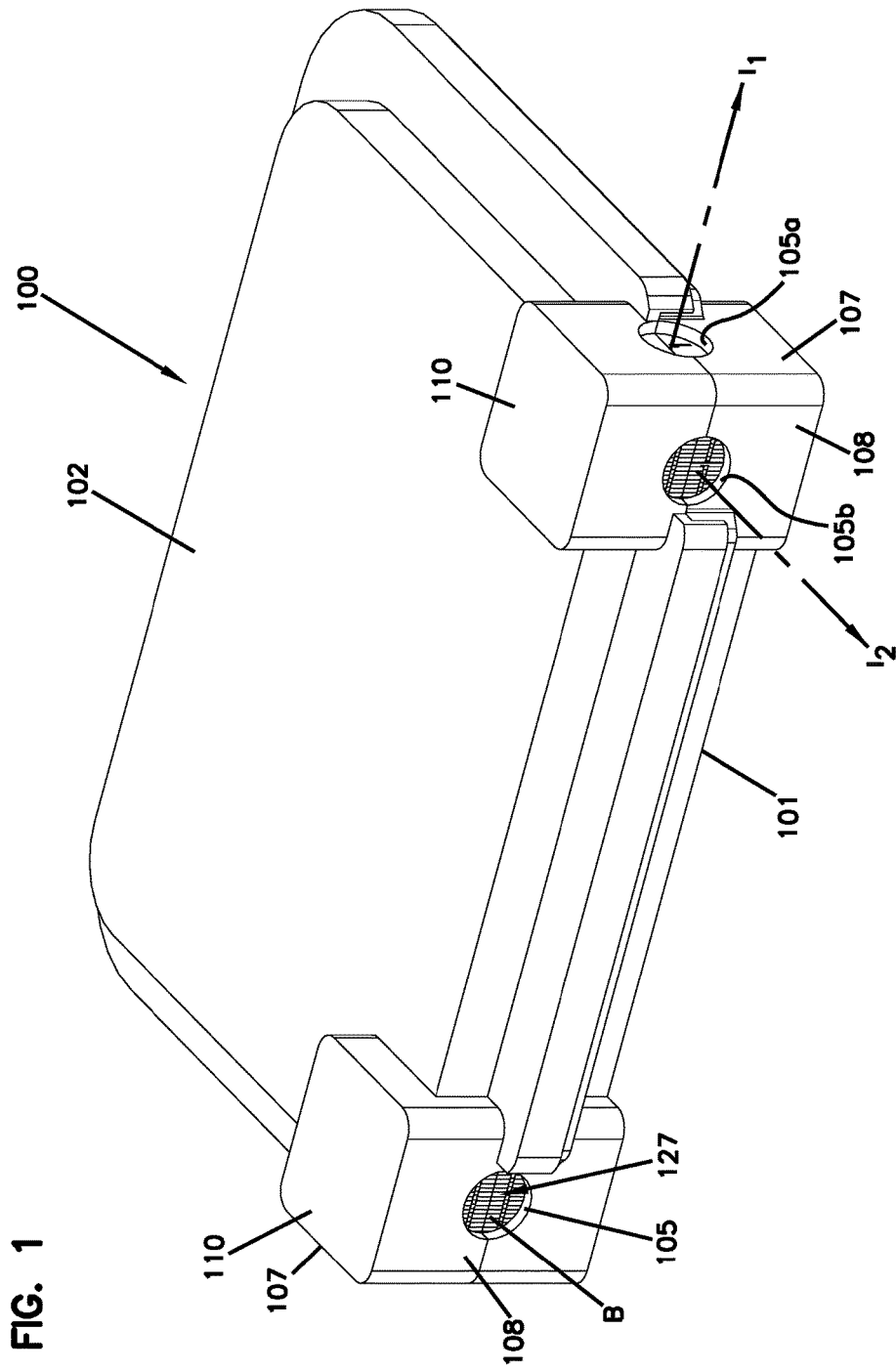
FIG. 1 is a perspective view of an example enclosure defining cable sealing block mounts at corners of the enclosure.
Figure 2:
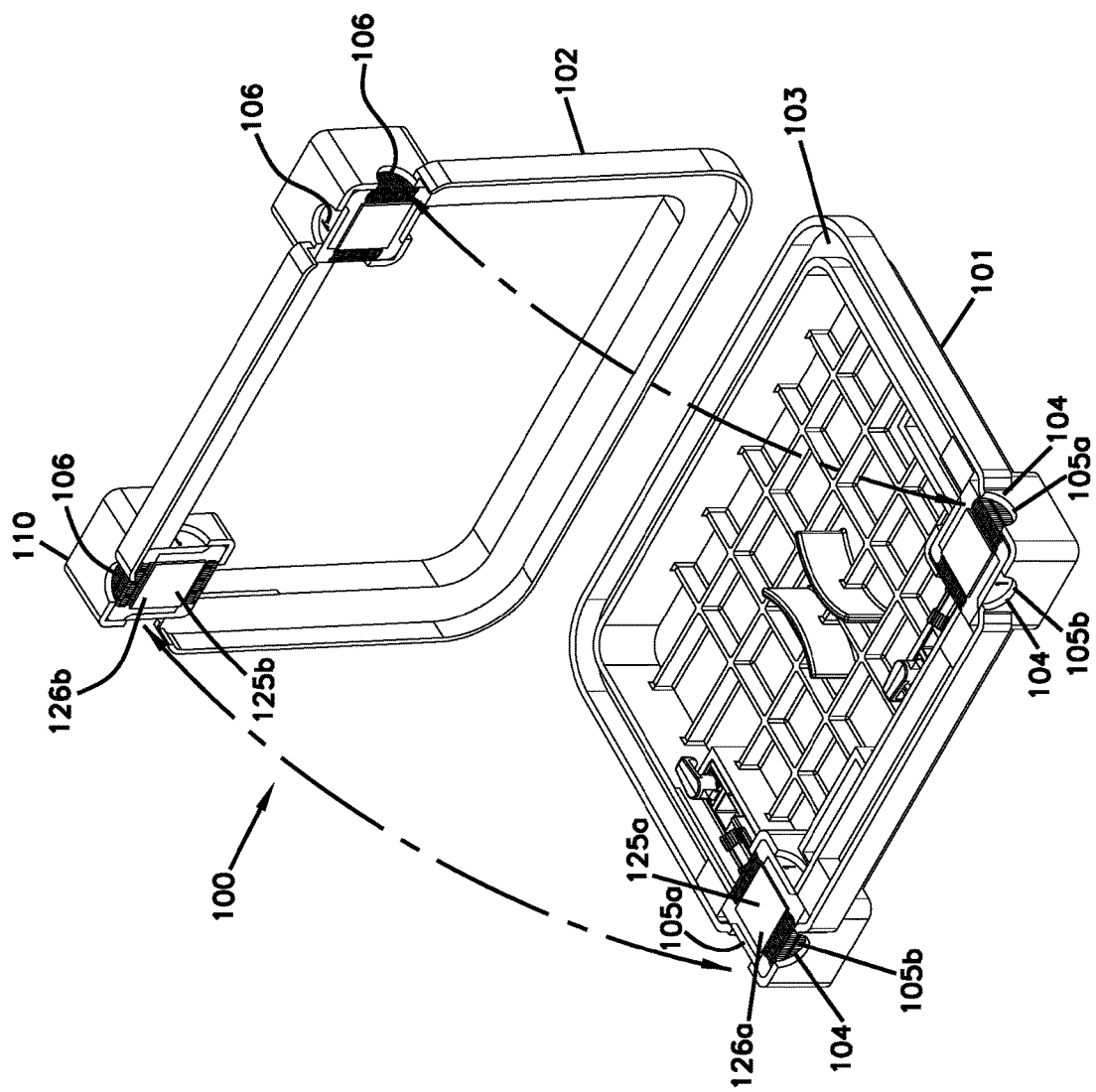
FIG. 2 is a perspective view of the enclosure of FIG. 1 showing the cover moved to an open position and showing one of the sealing block arrangements s rotated 90° as compared to FIG. 1.

FIGS. 1 and 2 illustrate an example enclosure housing 100 including a base 101 and a cover 102 that cooperate to define an interior. As shown in FIG. 2, at least the base 101 defines a channel arrangement 103 around at least part of the periphery of the base 101. One or more gaskets or other seals can be disposed in the channel arrangement 103 to provide environmental sealing between the base 101 and cover 102 when the cover 102 is assembled on the base 101. The base 101 and the cover 102 also cooperate to define cable ports 105. For example, the base 101 defines one or more first cutout or notched sections 104 and the cover 102 defines one or more second cutout or notched sections 106. The second cutout or notched sections 106 align with the first cutout or notched sections 104 to define the cable ports 105 when the cover 102 is assembled on the base 101.

In accordance with some of the aspects of the disclosure, the base 101 and the cover 102 cooperate to define one or more sealing block mounts 110. A sealing block 120 arrangement (FIG. 3) can be disposed in each sealing block mount 110. Each sealing block arrangement 120 is configured to provide environmental sealing around a cable routed through one of the cable ports 105. In certain implementations, each sealing block arrangement 120 is disposed and configured to cooperate with the gasket or other seal disposed in the channel arrangement 103 to provide environmental sealing to the enclosure housing 100. In certain implementations, the sealing block mounts 110 are disposed at one or more corners of the housing 100.

As will be discussed in greater detail herein, each sealing block 120 includes one or more containment walls 127 bounding one or more volumes of sealant 126. The containment wall 127 is configured to move (e.g., separate) to enable a cable to extend through the volumes of sealant 126 (e.g., between first and second volumes of sealant). In certain implementations, the amount by which the containment wall 127 moves varies according to the size of the cable to be accommodated. In some implementations, the volumes of sealant 126 are bounded by containment walls 127 on two sides. In other implementations, the volumes of sealant 126 are bounded by containment walls 127 on four sides. In still other implementations, the volumes of sealant 126 are bounded by a containment wall 127 on one side.

In some implementations, the volume of sealant 126 is a gel-type seal. Examples of pressurized gel-type seals are disclosed by document EP 0442941 B1 and document EP 0587616 B1. Both of these documents disclose gel-type cable seals that are pressurized through the use of threaded actuators. The volumes of sealant 126 can be pressurized by pressing the volumes 126 of two sealing blocks 120 against each other while mounted in the sealing block mounts 110. Positioning a cable between the volumes of sealant 126, as will be discussed herein, applies even more pressure to the sealant 126.

In certain implementations, the sealant 126 may comprise gel and/or gel combined with another material such as an elastomer. The gel may comprise, for example, silicone gel, urea gel, urethane gel, thermoplastic gel, or any suitable gel or geloid sealing material. Gels are normally substantially incompressible when placed under a compressive force and normally flow and conform to their surroundings, thereby forming sealed contact with other surfaces. Example gels include oil-extended polymers. The polymer may, for example, comprise an elastomer or a block copolymer having relatively hard blocks and relatively elastomeric blocks. Example copolymers include styrene-butadiene or styrene-isoprene di-block or tri-block copolymers. In still other examples, the polymer of the gel may include one or more styrene-ethylene-propylene-styrene block copolymers. Extender oils used in example gels may, for example, be hydrocarbon oils (e.g., paraffinic or naphthenic oils or polypropene oils, or mixtures thereof). The sealant 126 also can include additives such as moisture scavengers, antioxidants, tackifiers, pigments, and/or fungicides. In certain embodiments, sealing members in accordance with the principles of the present disclosure have ultimate elongations greater than 100 percent with substantially elastic deformation to an elongation of at least 100 percent. In other embodiments, sealing members in accordance with the principles of the present disclosure have ultimate elongations of at least 200 percent, or at least 500 percent, or at least 1000 percent. Ultimate elongation can be determined by the testing protocol set forth at ASTM D412.

Each sealing block arrangement 120 is configured to mount within one of the sealing block mounts 110. In certain implementations, each sealing block mount 110 includes a first wall 107 and a second wall 108 that are angled relative to one another and that cooperate to define the corresponding corner of the housing 100. The first wall 107 defines a first cable port 105*a* and the second wall 108 defines a second cable port 105*b*. Each cable port 105*a*, 105*b* defines a corresponding insertion axis $I_1$, $I_2$ along which a cable can pass through the cable port 105*a*, 105*b*.

Figure 3:
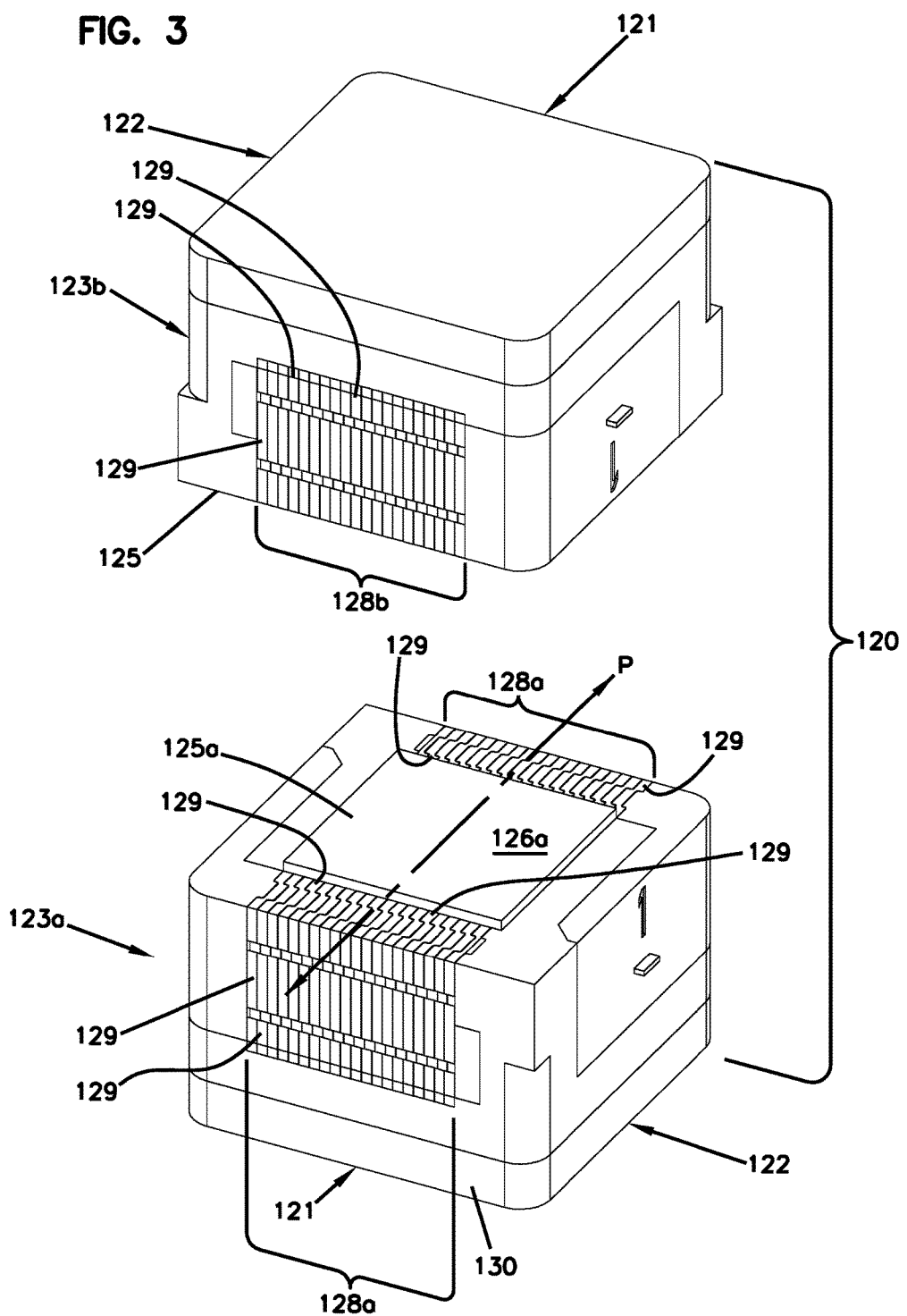
FIG. 3 is a perspective view of an example sealing block arrangement suitable for use with the enclosure of FIG. 1.

As shown in FIG. 3, each sealing block arrangement 120 includes at least one pass-through side 121 along which the containment wall 127 extends. In the example shown, each sealing block arrangement 120 includes two pass-through sides 121 on opposite sides of sealant. The two pass-through sides 121 align along a sealed cable path P that extends across the sealant. Each sealing block arrangement 120 is configured to mount within a corresponding sealing block mount 110 with one of the pass-through sides 121 facing one of the first and second cable ports 105*a*, 105*b*. Accordingly, a cable can be routed into the enclosure 100 through the cable port 105*a*, 105*b* facing the pass-through side 121.

In certain implementations, each sealing block arrangement 120 also includes sealing sides 122 that extend between the pass-through sides 121. In certain examples, one of the sealing sides 122 faces the other of the first and second cable port 105*a*, 105*b* when the sealing block arrangement 120 mounts within the sealing block mount 110. The sealing side 122 fixedly bounds the sealant so that a cable cannot be routed into the enclosure 100 through the cable port 105*a*, 105*b* facing the sealing side 122.

As shown in FIGS. 2 and 3, each sealing block arrangement 120 includes a first sealing block 123*a* and a second sealing block 123*b* that each define part of the pass-through sides 121 and part of the sealing sides 122. For example, each sealing block 123*a*, 123*b* forms part of the containment wall 127. The first sealing block 123*a* includes a first set 128*a* of containment elements 129 and the second sealing block 123*b* includes a second set 128*b* of containment elements 129. As shown in FIGS. 2 and 3, the sets 128*a*, 128*b* of containment elements 129 and the sealing sides 122 of the sealing blocks 123, 123*a*, 123*b* cooperate to bound respective volumes of sealant 126*a*, 126*b* of the sealing blocks 123*a*, 123*b*. In some implementations, the first and second sealing blocks 123*a*, 123*b* are identical to each other. In other implementations, the first sealing block 123 is a first type of sealing block and the second sealing block is a second type of sealing block as will be described in more detail here.

As shown in FIG. 2, each sealing block mount 110 includes a first receptacle defined in the base 101 and a second receptacle defined in the cover 102. Mounting a sealing block arrangement 120 within a sealing block mount 110 includes disposing the first sealing block 123*a* within one of the receptacles and disposing the second sealing block 123*b* within the other of the receptacles. The sealing blocks 123*a*, 123*b* define opposing cable interfaces 125*a*, 125*b* that are configured to sealingly engage each other when the cover 102 and base 101 are assembled. When a cable passes through the sealing block arrangement 120, the cable passes between the cable sealing interface 125, 125*a*, 125*b* of the sealing blocks 123, 123*a*, 123*b*.

In certain implementations, the volume of sealant 126, 126*a*, 126*b* defines at least part of the cable sealing interface 125, 125a, 125b of the sealing block 123, 123a, 123b. Accordingly, the volumes of sealant 126a, 126b of each sealing block 123a, 123b contact the cable passing through the sealing block arrangement 120. In certain examples, the volume of sealant 126, 126a, 126b defines a majority of the cable interface 125, 125a, 125b, respectively. In certain examples, the volume of sealant 126, 126a, 126b defines about half of the cable interface 125, 125a, 125b, respectively. In certain examples, the volume of sealant 126, 126a, 126b defines a central region of the cable interface 125, 125a, 125b, respectively.

Furthermore, when a cable is routed through the sealing block arrangement 120, one or more containment elements 129 of the containment wall 127 are displaced to accommodate the cable. For example, containment elements 129 of the first set 128a and containment elements 129 of the second set 128b move away from each other to define a space through which the cable passes (e.g., see FIG. 4). Accordingly, the containment elements 129 are arranged relative to each other so that the wall 127 takes on the general shape of the cable.

Figure 4:
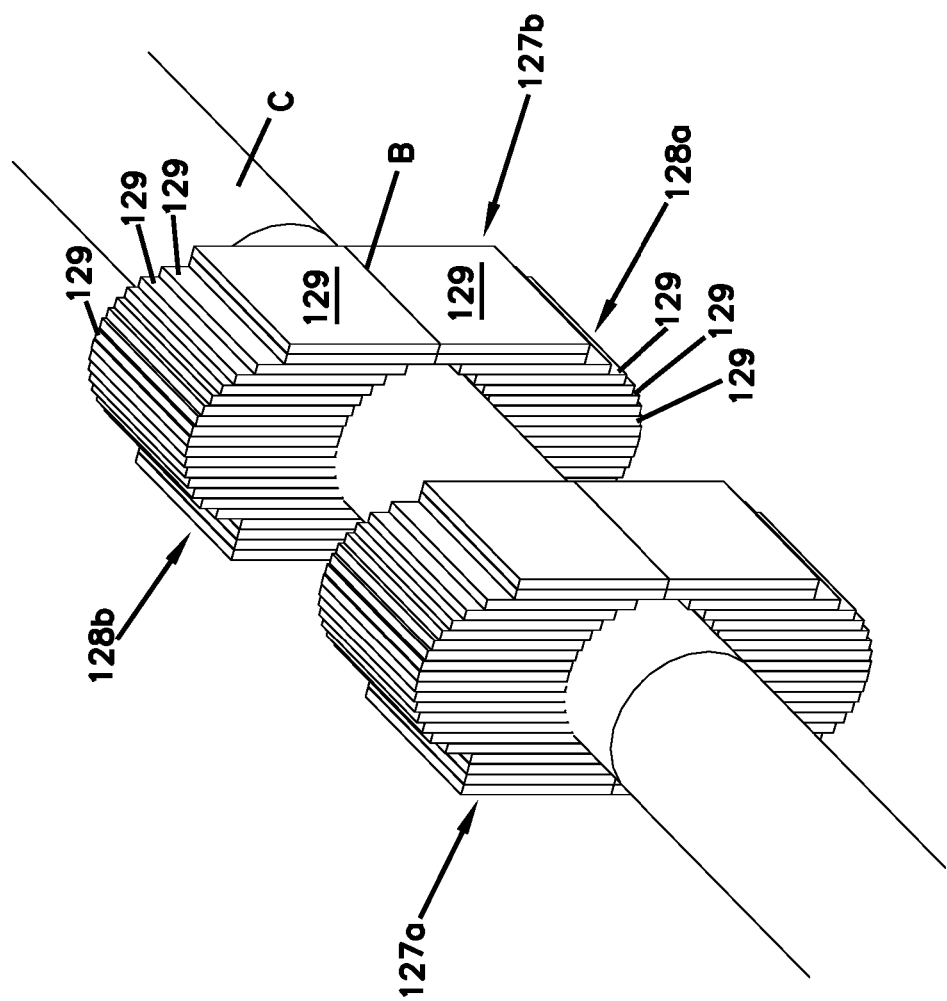
FIG. 4 schematically shows a cable extending through two containment walls suitable for use with the sealing block arrangement of FIG. 3.

For example, FIG. 4 shows a cable C extending between a first containment wall 127a and a second containment wall 127b. For ease in viewing, no volumes of sealant 126, 126a, 126b and no sealing walls 122 are shown disposed between the first and second containment walls 127a, 127b. Mating surfaces of the containment elements 129 of the first set 128, 128a either contact the cable C or contact mating surfaces of the containment elements 129 of the second set 128, 128b. The containment elements 129 inhibit movement of the volume of sealant past the containment wall 127, 127a, 127b while the separation between opposing containment elements 129 of the first and second sets 128a, 128b accommodates an outer diameter of the cable C.

When a cable is not routed through the sealing block arrangement 120, mating surfaces of the containment elements 129 of the first set 128a contact mating surfaces of the containment elements 129 of the second set 128b at a boundary B. The boundary B at which the containment elements 129 meet generally aligns with the cable sealing interface 125, 125a, 125b.

Figure 5:
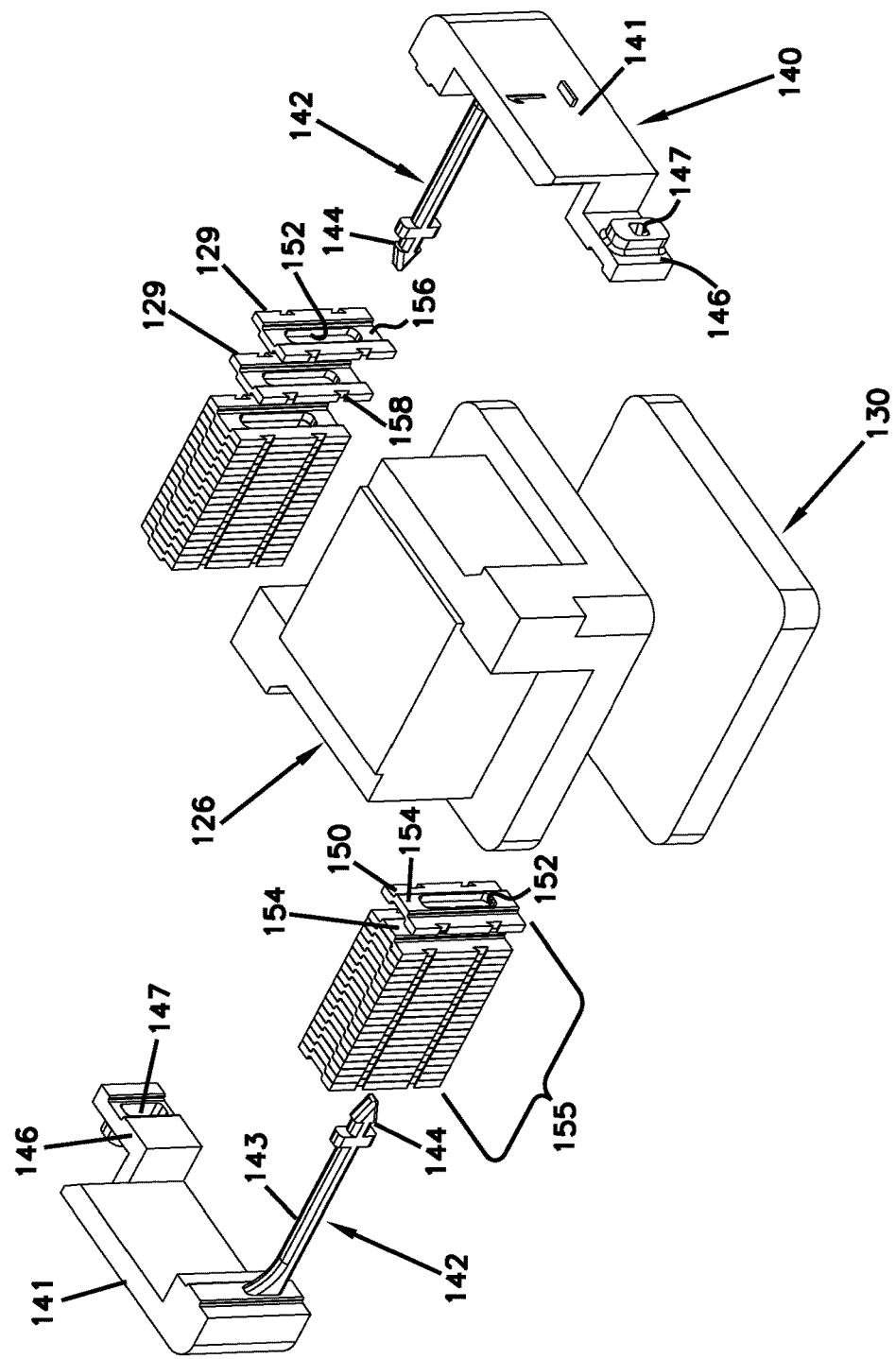
FIG. 5 is an exploded view of one of the sealing blocks of the sealing block arrangement of FIG. 3.

FIG. 5 illustrates one example implementation of a cable sealing block 123 configured in accordance with the principles of the present disclosure. The cable sealing block 123 includes a volume of sealant 126 having opposite first outer sides that interconnect opposite second outer sides. Containment elements 129 are configured to be disposed along the first outer sides of the volume of sealant 126. Boundary walls 140 are configured to be disposed along the second outer sides of the volume of sealant 126. The containment elements 129 and the boundary walls 140 cooperate to contain the volume of sealant 126.

In some implementations, the containment elements 129 include plate members 150 stacked one adjacent the other in a strip along an orientation parallel relative to the first outer sides of the volume of sealant 126. Each of the plate members 150 defines an elongated opening 152. The elongated openings 152 of the plate members 150 align with each other along an orientation perpendicular to the boundary B at which the mating surfaces of the containment elements 129 meet with containment elements of another sealing block 123. A retention member 142 extends through the elongated openings 152 of a strip 155 of plate members 150 to retain the plate members 150. Each plate member 150 is slidable relative to the retention member 142 so that the retention member 142 moves along the length of the elongated opening 152.

In certain implementations, each retention member 142 extends from one of the boundary walls 140. For example, the boundary wall 140 may include a bounding surface 141 that extends across one of the second sides of the volume of sealant 126. The retention member 142 extends from one side of the bounding surface 141. In certain examples, the retention member 142 includes an elongated member 143 with a prong member 144 at a distal end. The prong member 144 and elongated member 143 are sized to fit through the elongated openings 152 of the plate members 150. The elongated member 143 is sufficiently long to extend across all of the plate members 150 in a strip 155.

In certain implementations, each boundary wall 140 also defines a receptacle 147 disposed at the opposite side of the bounding surface 141 from the retention member 142. For example, the receptacle 147 may be defined in a tab 146 coupled to the bounding surface 141. The prong member 142 is sized and configured to fit within the receptacle 147. Accordingly, two boundary walls 140 can be disposed at the second outer sides of the volume of sealant 126 so that the retention members 142 extend towards the receptacle 147 of the other boundary wall 140. In certain examples, the prong member 142 is configured to snap, latch, or otherwise lock within the receptacle 147 of the opposing boundary wall 140.

In some implementations, the plate members 150 are configured to inhibit rotation or other non-slidable movement relative to each other. In the example shown in FIG. 5, each plate member 150 includes a protrusion 154 and a depression 156. The protrusion 154 of one plate member 150 fits within the depression 156 of an adjacent plate member 150. Engagement between the protrusion 154 and the depression 156 inhibits rotational or torquing movement of the plate members 150 relative to each other while allowing slidable movement of the plate members 150 relative to each other. In other implementations, the orientation of the plate members 150 can be otherwise retained. In certain examples, each plate member 150 also defines outer notches 158 that align with each other.

Routing a cable across the containment wall 127 causes at least some containment elements 129 of a first sealing block 123a to shift in a first direction relative to the retention member 142 and causes at least some containment elements 129 of a second sealing block 123b to shift in a second, opposite direction relative to the retention member 142 to accommodate the cable. Routing the cable across the cable interface 125 of the sealing block 123 causes the volume of sealant 126 to displace away from the cable C.

To accommodate the displacement, a spring element 130 (FIG. 3) is disposed beneath the volume of sealant 126. The spring element 130 compresses and expands to accommodate various amounts of displacement of the volume of sealant 126. For example, a cable having a first outer diameter will displace the volume of sealant 126 and compress the first spring element 130 by a first amount; another cable having a second, larger outer diameter will displace the volume of sealant 126 and compress the first spring element 130 by a second, greater amount. In certain implementations, the spring elements 130 also applies pressure to the volume of sealant 126, which allows the sealant 126 to apply a sealing pressure to the cable.

Figure 6:
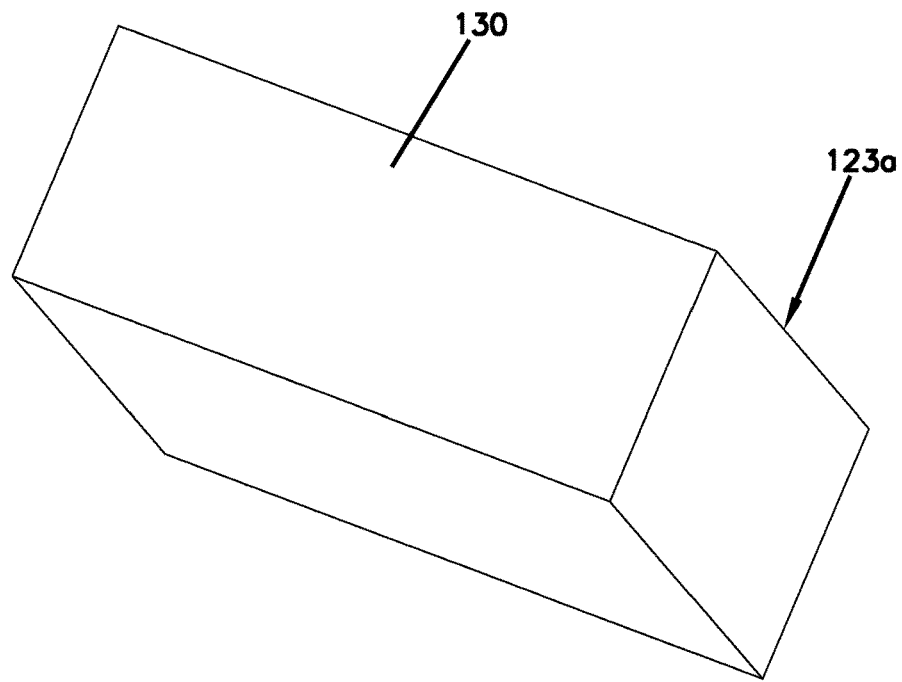
FIGS. 6-8 illustrate various example types of spring elements suitable for use with any of the cable sealing block arrangements disclosed herein.
Figure 7:
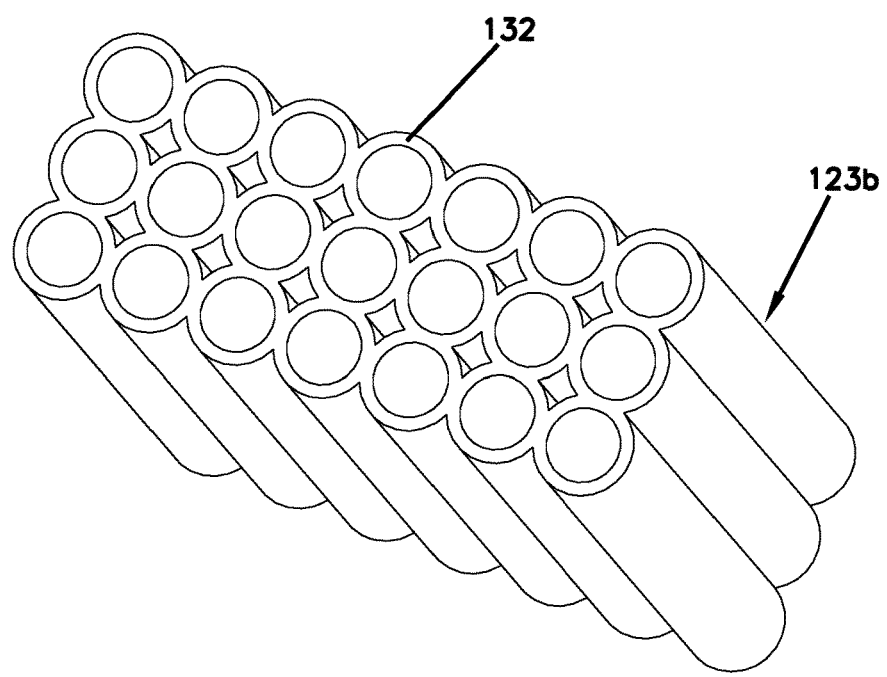
Figure 8:
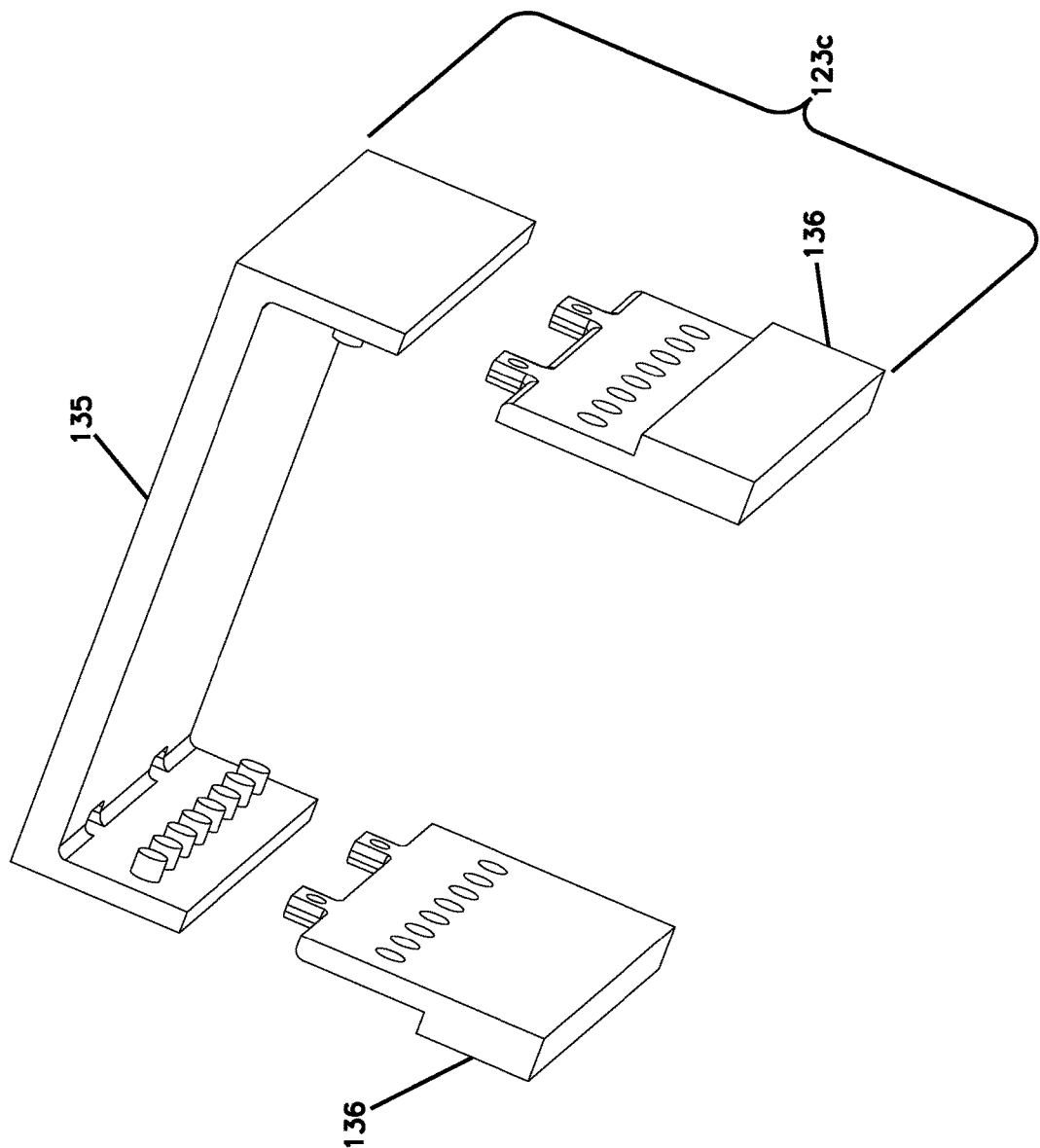

FIGS. 6-8 illustrate three example implementations of a spring element 130. A first example spring element 130a includes a foam block 131 as shown in FIG. 6. Displacement of the volume of sealant 126 compresses at least part of the foam block 131. A second example spring element 130b includes a plurality of tubes 132 as shown in FIG. 7.

Displacement of the volume of sealant 126 compresses at least part of the tubes 132. In certain examples, the tubes 132 are hollow or filled with air. In other implementations, the tubes 132 are filled with a compressible material. In some implementations, the tubes 132 are monolithically formed. In other implementations, the tubes 132 are fixed together with a webbing. In still other implementations, the tubes 132 are held together by an external containment element (e.g., portions of the base 101 and cover 102). A third example spring element 130c includes a trampoline 135 as shown in FIG. 8. The trampoline 135 extends between at least two support members 136 that elevate the trampoline 135 to provide a deflection space into which the trampoline 135 can flex. Displacement of the volume of sealant 126 flexes the trampoline 135 so that the volume of sealant 126 and trampoline 135 move into the deflection space.

Figure 9:
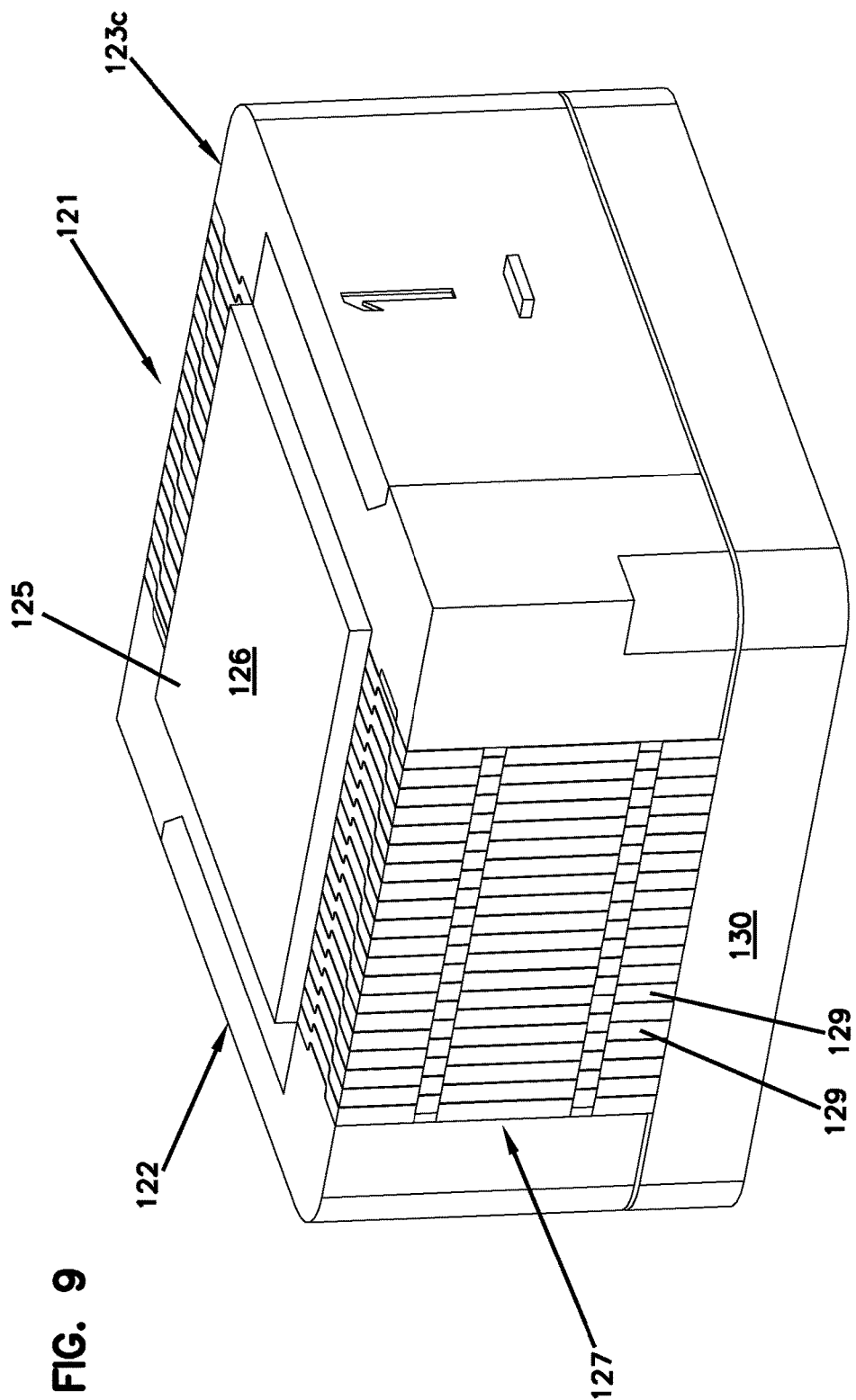
FIG. 9 illustrates an alternative implementation of a sealing block.

In certain implementations, the spring element 130 is configured to bias the containment members 129 of the containment wall 127 towards the boundary B. In some implementations of a sealing block 122c, the containment members 129 directly contact the spring element 130 (see FIG. 9). In other implementations, a portion of the volume of sealant 126 is disposed between the containment members 129 and the spring element 130 (see FIG. 3). In certain examples, each sealing block arrangement 120 includes a first spring element 130 disposed between the first volume of sealant 126a and the base 101 and a second spring element 130 disposed between the second volume of sealant 126b and the cover 102.

In accordance with some aspects of the disclosure, the enclosure 100 is selectively configurable in any one of an in-line cable configuration, a butt-style cable configuration, or an angled cable configuration by routing a cable through selected ones of the cable ports 105a, 105b. In the example shown in FIG. 1, the enclosure 100 is configured with a butt-style cable configuration by routing the cable through the cable port 105b at the first sealing block mounts 110, looping the cable within the enclosure 100, and routing the cable through the cable port 105b in the second sealing block mount 110.

In other examples, the enclosure 100 can be configured with an in-line cable configuration using different sealing blocks that provide the containment wall at the cable ports 105a instead of cable ports 105b. A cable is then routed through the cable port 105a at a first sealing block mount 110, linearly through the enclosure interior, and through the cable port 105 at a second sealing block mount 110. In still other examples, the enclosure 100 is configured with angled cable configuration by positioning a first sealing block 120 so that a containment wall 127 of the first sealing block extends across the cable port 105a of one of the sealing block mounts 110 and positioning a second sealing block 120 so that a containment wall of the second sealing block extends across the cable port 105b of another of the sealing block mounts 110 (see FIGS. 2 and 11). A cable is then routed through the cable port 105a, through the enclosure 100, and through the cable port 105b.

Figure 10:
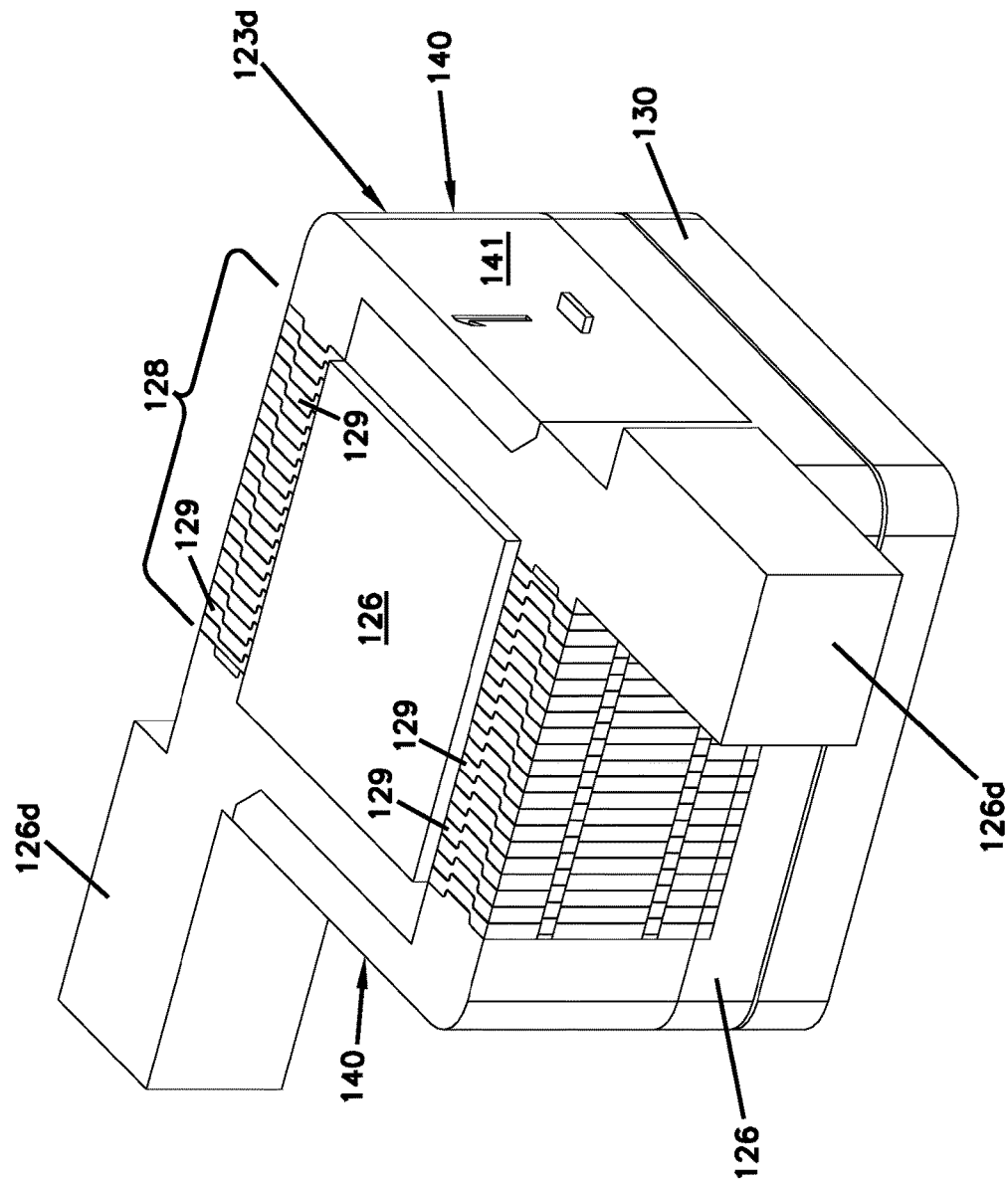
FIG. 10 illustrates another alternative implementation of a sealing block.

In some implementations, the sealing blocks 123, 123a, 123b, 123c are identical to each other. In other examples, however, the enclosure 100 can be populated by two different types of sealing blocks. FIG. 10 illustrates a first example type of sealing block 123d that fits into a receptacle in the base 101 or cover 102 in only one rotational position. The sealing block 123d includes boundary walls 140 holding containment elements 129 to a volume of sealant 126 to form sections 128 of a containment wall 127. The volume of sealant 126 includes extensions 126d that extend outwardly past the boundary walls 140 and the sets 128 of contact elements 129. The extensions 126d of the sealant 126 are configured to extend into the channel arrangement 103 to facilitate engagement between the volume of sealant 126 and the gasket or seal within the channel arrangement 103.

Figure 11:
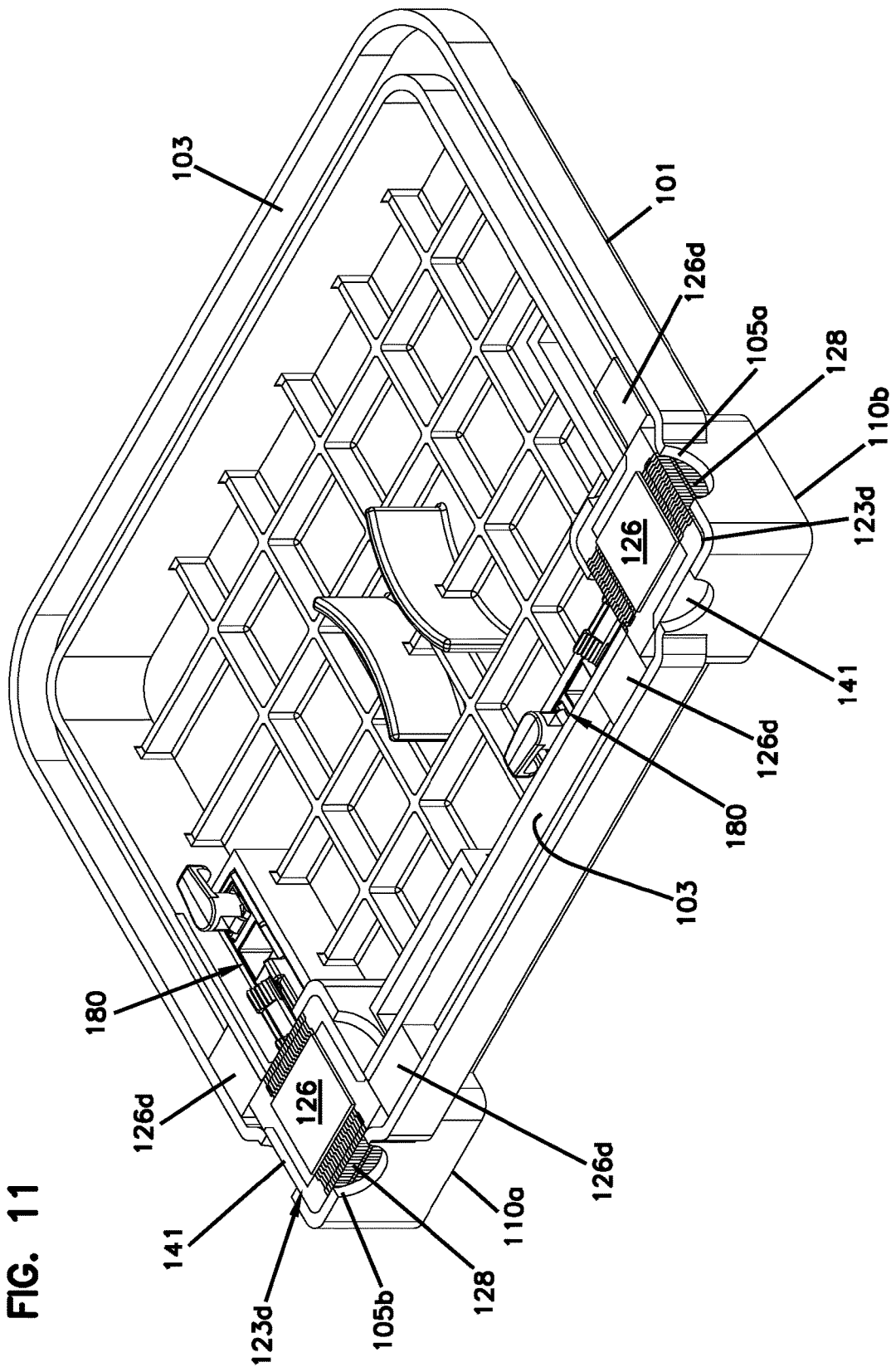
FIG. 11 illustrates a base of an enclosure having a sealing block disposed in a first receptacle to seal a first cable port and another sealing block disposed in a second receptacle to seal a second cable port that faces a different direction than the first cable port.

The sealing block 123d fits within each sealing block mount receptacle in only one orientation so that the sealant extensions 126d fit into the channel arrangement 103. As shown in FIG. 11, the sealing block 123d fits within a first sealing block mount receptacle 110a in an orientation that aligns the containment wall section 128 with the second cable port 105b. However, the sealing block 123d fits within a second sealing block mount receptacle 110b in an orientation that aligns the containment wall section 128 with the first cable port 105a. Accordingly, a second type of sealing block is manufactured to substantially resemble the sealing block 123d of FIG. 10, except that the sealant extensions 126d extend from opposite corners of the sealing block.

A sealing block of the first type 123d and a sealing block of the second type cooperate to form one sealing block arrangement 120. Furthermore, the containment wall section 128 of the second type of sealing block would align with the first cable port of the first receptacle 110a. Accordingly, a user can configure the enclosure 100 in one of an in-line configuration, a butt-style configuration, and an angled configuration by choosing which of the first and second types of sealing blocks to install at the sealing block mount receptacles. The user can mount cable anchor arrangements 180 within the enclosure 100 adjacent the containment walls 127.

Figure 12:
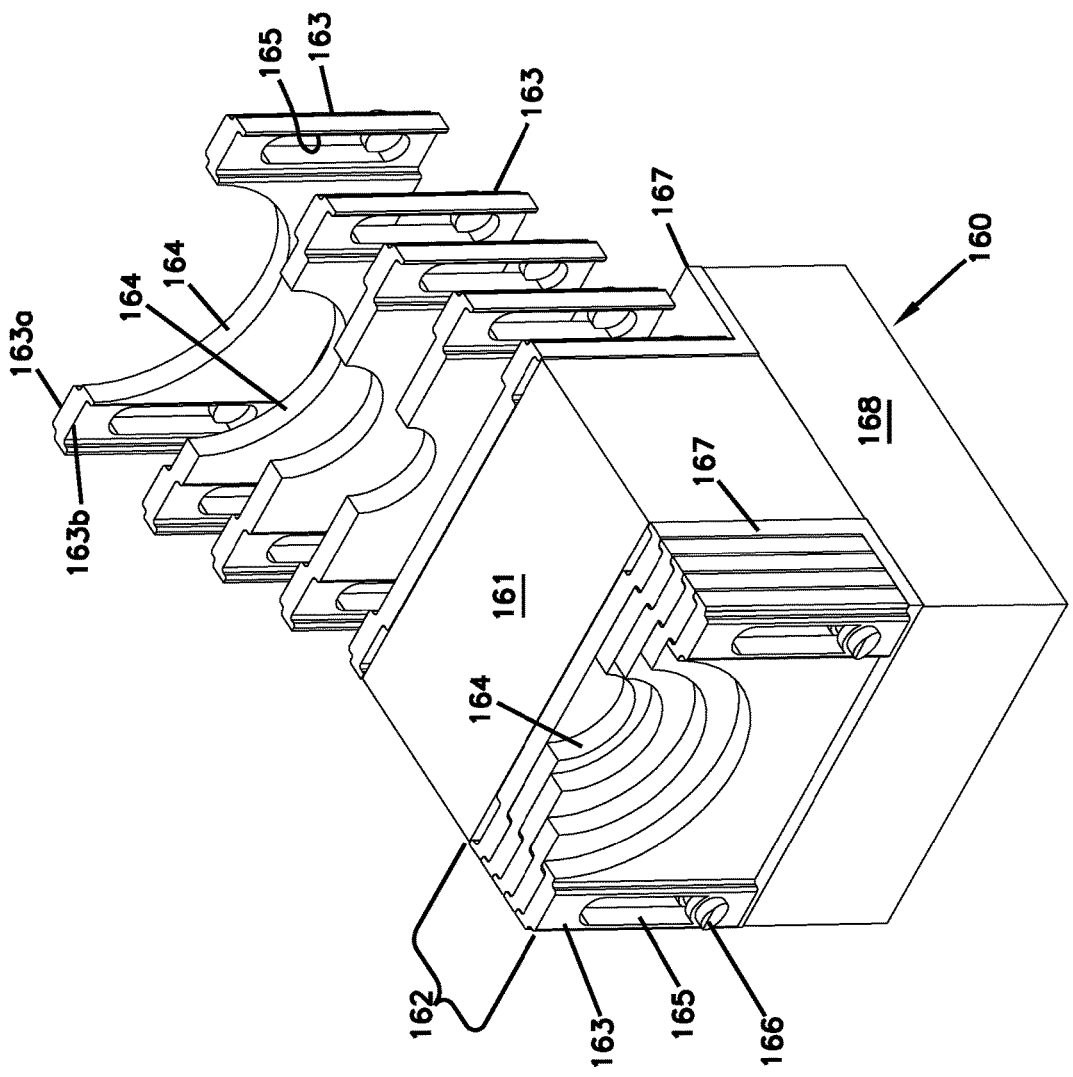
FIG. 12 is a perspective view of another example seal block suitable for use in a sealing block arrangement as disclosed herein.

FIG. 12 illustrates yet another example cable sealing block 160 suitable for use with the enclosure 100. The cable sealing block 160 includes a volume of sealant 161, a first section 162 of a containment wall at a first outer side of the sealant 161, a second section 162 of a containment wall at an opposite side of the sealant 161, and a spring element 168. The volume of sealant 161 seats on the spring element 168. In the example shown, the sections 162 of the containment wall also seat on the spring element 168.

Each section 162 of the containment wall includes a plurality of containment members 163 stacked one adjacent the other along an orientation perpendicular relative to the first outer side of the sealant 161. At least some of the containment members 163 have cut-outs 164 facing away from the spring element 168. The cut-outs 164 of the containment members 163 cooperate to define a cable passage through a sealant containment wall formed by two opposing sealing blocks 160.

When a cable is routed across a cable interface of the seal block 160, the cable is accommodated in the cut-outs 164 of the containment members 163. The containment members 163 are slidable against the bias of the spring element 168 when engaged by a cable. Accordingly, a containment member 163 can be slid against the bias of the spring 168 if the cut-out 164 of the cable is too small to accommodate the cable. Sliding the containment member 163 against the bias of the spring 168 moves the cut-out 164 sufficient to allow the cable to extend across the volume of sealant 161.

In certain implementations, the cut-outs 164 of the containment members 163 of a section 162 are different sizes. For example, in some examples, the outer-most containment members 163 of the sections 162 have larger cut-outs 164 than the inner-most containment members 163. In certain examples, the outermost containment member 163 of the section 162 has a first cut-out 164 having a first size, the adjacent containment member 163 has a second cut-out 164 having a second size smaller than the first size, and each subsequent containment member 163 has a cut-out 164 having an even smaller size than the previous containment member 163.

Accordingly, a cable having an outer diameter of less than the first size will lay across the volume of sealant without moving the containment members 163. However, if a cable having an outer diameter that is larger than the first size and smaller than the second size is laid across the volume of sealant, the cable will move the inner-most containment member 163 against the bias of the spring element 168. If a cable having an outer diameter larger than the second size is laid across the sealing block 160, then the cable will move the outer-most containment member 163 and the adjacent containment member 163 against the bias of the spring element 168.

In some implementations, the containment members 163 are configured to inhibit rotation or other non-slidable movement relative to each other. In the example shown, each containment member 163 includes one or more protrusions 163a and one or more depressions 163b. The protrusion(s) 163a of one containment member 163 fits within the depression(s) 163b of an adjacent containment member 163. Engagement between the protrusion(s) 163a and the depression(s) 163b inhibits rotational or torquing movement of the containment members 163 relative to each other while allowing slidable movement of the containment members 163 relative to each other. In other implementations, the orientation of the containment members 163 can be otherwise retained.

In certain implementations, each of the containment members 163 defines an elongated opening 165. The elongated openings 165 of the containment members 163 align with each other along an orientation perpendicular to the boundary B at which the mating surfaces of the containment members 163 meet with containment members of an opposing sealing block 160. Pegs 166 of adjacent containment members 163 extends into the elongated openings 165 to control sliding movement of the containment members 163.

In certain implementations, each section 162 of the containment wall also includes a base 167 that supports the containment members 163. In certain examples, the base 167 includes a section that extends between the containment members 163 and the spring element 168. In certain examples, each base 167 includes a section that resembles a containment member 163, except the section does not define a cut-out 164. Accordingly, the base 167 is biased against the spring element 168 whenever a cable is routed across the seal block 160. The section of the base 167 that resembles a containment member 163 can include the protrusions 163a and/or pegs 166 of a containment member.

Having described the preferred aspects and implementations of the present disclosure, modifications and equivalents of the disclosed concepts may readily occur to one skilled in the art. However, it is intended that such modifications and equivalents be included within the scope of the claims which are appended hereto.

LIST OF REFERENCE NUMERALS AND CORRESPONDING FEATURES

| | |
|---|---|
| 100 | enclosure housing |
| 101 | base |
| 102 | cover |
| 103 | channel arrangement |
| 104 | cut-out or notched section |
| 105, 105a, 105b | cable ports |
| 106 | cut-out or notched section |
| 107 | first wall |
| 108 | second wall |
| 110 | cable sealing block mounts |
| 120 | cable sealing block arrangement |
| 121 | pass-through side |
| 122 | sealing side |
| 123, 123a, 123b, 123c, 123d, 160 | sealing block |
| 125, 125a, 125b | cable interfaces |
| 126, 126a, 126b, 161 | volumes of sealant |
| 127 | containment walls |
| 128, 128a, 128b, 162 | sets/sections of containment wall |
| 129, 163 | containment elements |
| 130, 130a, 130b, 130c, 168 | spring element |
| 131 | foam block |
| 132 | tubes |
| 135 | trampoline |
| 136 | support members |
| 140 | boundary wall |
| 141 | bounding surface |
| 142 | retention member |
| 143 | elongated member |
| 144 | prong member |
| 146 | tab |
| 147 | receptacle |
| 150 | plate member |
| 152, 165 | elongated opening |
| 155 | strip |
| 154, 163a | protrusion |
| 156, 163b | depression |
| 158 | notches |
| 164 | cut-outs |
| 166 | pegs |
| 167 | base |
| 180 | cable anchor arrangement |
| B | boundary |

What is claimed is:

1. A sealing unit comprising:
a sealant arrangement including first and second volumes of sealant that meet at a cable sealing interface;
a sealant containment wall positioned at an outer side of the sealant arrangement, the sealant containment wall including a first set of containment elements providing containment of the first volume of sealant at the outer side of the sealant arrangement and a second set of containment elements providing containment of the second volume of sealant at the outer side of the sealant arrangement, the containment elements of the first set of containment elements meeting the containment elements of the second set of containment elements at a boundary that generally aligns with the cable sealing interface, the containment elements of the first and second sets of containment elements being configured to slide in opposite directions away from the boundary to allow passage of a cable through the sealant containment wall, the first set of containment elements including a plurality of first plates arranged in a first stack in front of the first volume of sealant, the second set of containment elements including a plurality of second plates arranged in a second stack in front of the second volume of sealant, and the first and second plates being configured to independently slide parallel to each other;
a first spring element for biasing the containment elements of the first set of containment elements toward the boundary; and
a second spring element for biasing the containment elements of the second set of containment elements toward the boundary.

2. The sealing unit of claim 1, wherein the first plates are stacked one in front of the other along an orientation perpendicular relative to an outer side of the first volume of sealant, and wherein the second plates are stacked one in front of the other along an orientation perpendicular relative to an outer side of the second volume of sealant.

3. The sealing unit of claim 2, wherein at least some of the first plates have cut-outs positioned adjacent the boundary, wherein at least some of the second plates have corresponding cut-outs positioned adjacent the boundary, and wherein the cut-outs of the first and second plates cooperate to define a cable passage through the sealant containment wall.

4. The sealing unit of claim 3, wherein outer ones of the first plates have larger cut-outs than inner ones of the first plates, and wherein outer ones of the second plates have larger cut-outs than inner ones of the second plates.

5. The sealing unit of claim 1, wherein the first plates are first strips and the second plates are second strips.

6. The sealing unit of claim 5, wherein the first strips are stacked one adjacent the other along an orientation parallel relative to an outer side of the first volume of sealant, and wherein the second strips are stacked one adjacent the other along an orientation parallel relative to an outer side of the second volume of sealant.

7. The sealing unit of claim 6, wherein the first and second strips each define elongate openings that are elongated along an orientation perpendicular to the boundary.

8. The sealing unit of claim 7, wherein the sealing unit includes a strip holder having a first retention member that passes through the elongate openings of the first strips and a second retention member that passes through the elongate openings of the second strips, the first strips being slidable relative to the first retention member and the second strips being slidable relative to the second retention member.

9. An enclosure comprising:
a housing defining a corner, the housing defining a sealing block mount at the corner, the sealing block mount defining a sealing block receptacle, the sealing block mount including first and second walls that are angled relative to one another and cooperate to define the corner, the first wall defining a first cable port and the second wall defining a second cable port; and
a sealing block arrangement that mounts within the sealing block receptacle, the sealing block arrangement including first and second opposite sides, the sealing block arrangement also including third and fourth opposite sides that extend between the first and second opposite sides, the sealing block arrangement being configured to mount within the sealing block receptacle with the first side in alignment with the first cable port and the third side in alignment with the second cable port.

10. The enclosure of claim 9, wherein the sealing block arrangement defines a sealed cable routing path that extends between the first and second sides such that a cable can be routed through the first cable port and through the sealing block along the sealed cable routing path into an interior of the housing.

11. The enclosure of claim 9, wherein the third side of the sealing block arrangement closes and seals the second cable port.

12. The enclosure of claim 11, wherein the third side of the sealing block arrangement is configured to prevent a cable from being routed into the housing through the second cable port.

13. The enclosure of claim 12, wherein the corner is a first corner, wherein the housing includes a second corner defining another one of the sealing block mounts that contains another one of the sealing blocks, the enclosure being selectively configurable in any one of an in-line cable configuration, a butt-style cable configuration or an angled cable configuration by selecting appropriate sealing block arrangements.

14. A sealing block kit for use with an enclosure including a base and a cover that cooperate to define a sealing block mount disposed at a corner of the housing, the sealing block mount including a first receptacle defined in the base and a second receptacle defined in the cover, the second receptacle opposing the first receptacle, the sealing block mount also defining a first cable port and a second cable port, the sealing block kit comprising:
a plurality of first sealing blocks, each first sealing block being configured to mount within any of the first and second receptacles, each first sealing block including pass-through sides that align along a corresponding sealed cable routing path, each first sealing block also including sealing sides that extend between the pass-through sides, each first sealing block being configured to mount within the first receptacle so that the pass-through sides of the sealing block arrangement align with the first cable port and the sealing sides align with the second cable port, and each first sealing block being configured to mount within the second receptacle so that the pass-through sides of the sealing block arrangement align with the second cable port and the sealing sides align with the first cable port; and
a plurality of second sealing blocks, each second sealing block being configured to mount within any of the first and second receptacles, each second sealing block including pass-through sides that align along a corresponding sealed cable routing path, each second sealing block also including sealing sides that extend between the pass-through sides, each second sealing block being configured to mount within the first receptacle so that the pass-through sides of the sealing block arrangement align with the second cable port and the sealing sides align with the first cable port, and each second sealing block being configured to mount within the second receptacle so that the pass-through sides of the sealing block arrangement align with the first cable port and the sealing sides align with the second cable port.

15. The sealing block kit of claim 14, wherein a first of the first sealing blocks and a first of the second sealing blocks cooperate to define a first sealing block arrangement disposed within the sealing block mount.

16. The sealing block kit of claim 15, wherein the sealing block is a first sealing block and wherein the housing defines a second sealing block mount at a second corner of the housing, wherein a second of the first sealing blocks and a second of the second sealing blocks cooperate to define a second sealing block arrangement disposed within the second sealing block.

17. The sealing block kit of claim 16, wherein the first of the sealing blocks of the first and second sealing block arrangements are disposed in the first receptacles of the first and second sealing block mounts.

18. The sealing block kit of claim 16, wherein the second of the sealing blocks of the first and second sealing block arrangements are disposed in the first receptacles of the first and second sealing block mounts.

19. The sealing block kit of claim 16, wherein the first of the sealing blocks of the first sealing block arrangement is disposed in the first receptacle of the first sealing block mount and wherein the second of the sealing blocks of the second sealing block arrangement is disposed in the first receptacle of the second sealing block mount.

20. A sealing unit comprising:
a first volume of sealant defining a cable sealing interface surface;
a first sealant containment wall positioned at a first outer side of the first volume of sealant, the first sealant containment wall including a first plurality of containment elements;
a second sealant containment wall positioned at a second outer side of the first volume of sealant, the second outer side being disposed opposite the first outer side, the second sealant containment wall including a second plurality of containment elements;
the first and second pluralities of containment elements cooperating to provide containment of the first volume of sealant therebetween, the containment elements of the first and second pluralities being configured to independently slide parallel to each other to allow passage of a cable through the first and second sealant containment walls; and
a first spring arrangement for biasing the containment elements of the first and second pluralities towards the cable sealing interface surface, the first spring arrangement including a first spring element.

21. The sealing unit of claim 20, wherein solid walls extend between the first and second sealant containment walls from opposite ends of the first and second sealant containment walls.

22. The sealing unit of claim 20, further comprising a second volume of sealant disposed on a surface opposing the cable sealing interface surface of the first volume of sealant.

23. The sealing unit of claim 22, wherein the first volume of sealant, the first and second sealant containment walls, and the first spring element are disposed in a first housing piece of an enclosure and wherein the second volume of sealant is disposed in a second housing piece of the enclosure.

24. The sealing unit of claim 22, further comprising:
a pair of containment walls positioned at opposite sides of the second volume of sealant, each of the pair of containment walls including a plurality of slidable containment elements; and
a second spring element for biasing the containment elements of the pair of containment walls towards the containment elements of the first and second sealant containment walls.

25. The sealing unit of claim 20, wherein the first spring arrangement includes a plurality of spring elements.

* * * * *